United States Patent
Chang

(10) Patent No.: US 9,162,874 B2
(45) Date of Patent: Oct. 20, 2015

(54) SEMICONDUCTOR STRUCTURE AND METHOD FORMING THE SAME

(71) Applicant: TAIWAN SEMICONDUCTOR MANUFACTURING COMPANY LTD., Hsinchu (TW)

(72) Inventor: Kuei-Sung Chang, Kaohsiung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 37 days.

(21) Appl. No.: 14/160,628

(22) Filed: Jan. 22, 2014

(65) Prior Publication Data

US 2015/0203347 A1    Jul. 23, 2015

(51) Int. Cl.
| | |
|---|---|
| B81B 7/00 | (2006.01) |
| B81C 1/00 | (2006.01) |
| H01L 23/535 | (2006.01) |
| H01L 23/06 | (2006.01) |
| H01L 23/48 | (2006.01) |

(52) U.S. Cl.
CPC ............. *B81B 7/007* (2013.01); *B81C 1/00301* (2013.01); *H01L 23/06* (2013.01); *H01L 23/481* (2013.01); *H01L 23/535* (2013.01)

(58) Field of Classification Search
None
See application file for complete search history.

(56) References Cited

U.S. PATENT DOCUMENTS

| | | | | |
|---|---|---|---|---|
| 5,668,033 A | * | 9/1997 | Ohara et al. | 438/113 |
| 5,798,557 A | * | 8/1998 | Salatino et al. | 257/416 |
| 6,452,238 B1 | * | 9/2002 | Orcutt et al. | 257/415 |
| 6,624,003 B1 | * | 9/2003 | Rice | 438/106 |
| 6,764,875 B2 | * | 7/2004 | Shook | 438/106 |
| 6,852,926 B2 | * | 2/2005 | Ma et al. | 174/539 |
| 6,953,993 B2 | * | 10/2005 | Yamaguchi | 257/704 |
| 2002/0000646 A1 | * | 1/2002 | Gooch et al. | 257/666 |
| 2006/0001123 A1 | * | 1/2006 | Heck et al. | 257/528 |
| 2007/0117275 A1 | * | 5/2007 | DCamp et al. | 438/127 |
| 2010/0127340 A1 | * | 5/2010 | Sugizaki | 257/415 |

* cited by examiner

*Primary Examiner* — Andres Munoz
(74) *Attorney, Agent, or Firm* — Chun-Ming Shih

(57) ABSTRACT

A semiconductor structure having a micro electromechanical system (MEMS) device is provided. The MEMS device includes a first and a second type electrical terminal, and a semiconductor interconnector. The semiconductor interconnector connects the first type electrical terminal with an external circuitry through a conductor. The conductor serves to electrically connecting the semiconductor interconnector with the first type electrical terminal. The second type electrical terminal surrounds the first type electrical terminal. In addition, the second type electrical terminal is interposed between the semiconductor interconnector and the first type electrical terminal. An isolative layer is provided around the conductor. The isolative layer is positioned under the first type electrical terminal, the second type electrical terminal and the semiconductor interconnector.

20 Claims, 10 Drawing Sheets

ND METHOD FORMING THE SAME

SEMICONDUCTOR STRUCTURE AND METHOD FORMING THE SAME

FIELD

The present disclosure relates to a semiconductor structure and method forming the same.

BACKGROUND

Wafer level packaging (WLP) technology provides for the packaging of semiconductor devices at a wafer level. WLP is employed in a variety of technologies including 3D-integrated circuits (IC), chip scale package (CSP) devices, and micro electromechanical systems (MEMS).

Micro electromechanical systems (MEMS) devices are small electro-mechanical systems often incorporated into integrated circuit devices. The fabrication and development of products encompassing MEMS devices has experienced numerous challenges including those of integrating the MEMS chips and integrated circuit chips together. Typically the chips may be placed side-by-side and then wire bonded together, which provides a product with a large footprint. Wafer level chip scale packaging of MEMS and CMOS devices is advantageous in that it can reduce packaging and integration costs, however, other issues arise. Measures to increase WLP MEMS device yield and reduce WLP MEMS device manufacturing cost are continuously being sought.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

Like reference symbols in the various drawings indicate like elements.

DETAILED DESCRIPTION OF THE DISCLOSURE

Figure 1A:
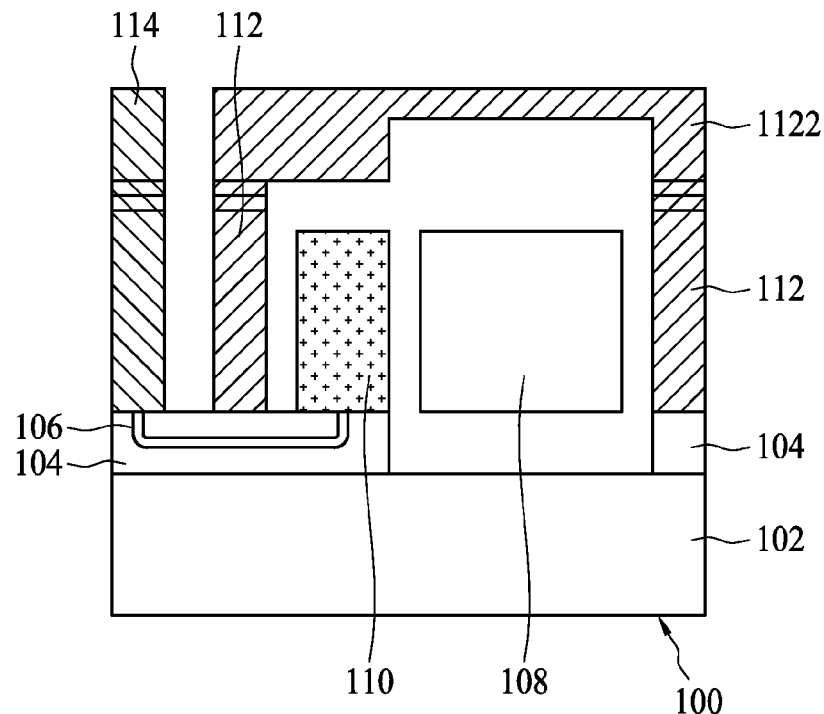
FIGS. 1A and 1B are different views of a semiconductor structure in accordance with some embodiments of the present disclosure.

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Throughout the various views and illustrative embodiments, like reference numerals are used to designate like elements. Reference will now be made in detail to exemplary embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, an apparatus in accordance with the present disclosure. It is to be understood that elements not specifically shown or described may take various forms. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

In the drawings, like reference numbers are used to designate like or similar elements throughout the various views, and illustrative embodiments of the present disclosure are shown and described. The figures are not necessarily drawn to scale, and in some instances the drawings have been exaggerated and/or simplified in places for illustrative purposes. One of ordinary skill in the art will appreciate the many possible applications and variations of the present disclosure based on the following illustrative embodiments of the present disclosure.

It will be understood that when an element is referred to as being "on" another element, it can be directly on the other element or intervening elements may be present. In contrast, when an element is referred to as being "directly on" another element, there are no intervening elements present.

It will be understood that singular forms "a", "an" and "the" are intended to include the plural forms as well, unless the context clearly indicates otherwise. Furthermore, relative terms, such as "bottom" and "top," may be used herein to describe one element's relationship to other elements as illustrated in the Figures.

It will be understood that elements described as "under" or "below" other elements would then be oriented "over" or "above" the other elements. The exemplary terms "under" or "below" can, therefore, encompass both an orientation of over and under.

Unless otherwise defined, all terms (including technical and scientific terms) used herein have the same meaning as commonly understood by one of ordinary skill in the art to which this disclosure belongs. It will be further understood that terms; such as those defined in commonly used dictionaries, should be interpreted as having a meaning that is consistent with their meaning in the context of the relevant art and the present disclosure, and will not be interpreted in an idealized or overly formal sense unless expressly so defined herein.

It is understood that the present disclosure refers generally to wafer level package (WLP) to refer to the packaging of a substrate. The substrates described herein may take various forms including but not limited to wafers (or portions thereof) having integrated circuits including those formed by CMOS-based processes, die, micro-electro-mechanical systems (MEMS) substrates, capping substrates, a single substrate with CMOS devices and MEMS devices formed thereon, and the like. In contrast, a substrate wafer may not include an integrated circuit. Furthermore, as described above, specific embodiments may be described herein which are exemplary only and not intended to be limiting. For example, embodiments that refer to a substrate being a MEMS substrate, a CMOS substrate, or the like are exemplary only and not intended to limit the disclosure to any particular technology. Additionally although described as providing for coupling two substrates, any number of substrates may be coupled according to aspects of the present disclosure. Further, though the present disclosure refers to micro electromechanical systems (MEMS) devices, one of ordinary skill in the art will find other applicable technologies that may benefit from the disclosure including, but not limited to, nanoelectromechanical systems (NEMS) devices.

Figure 1B:
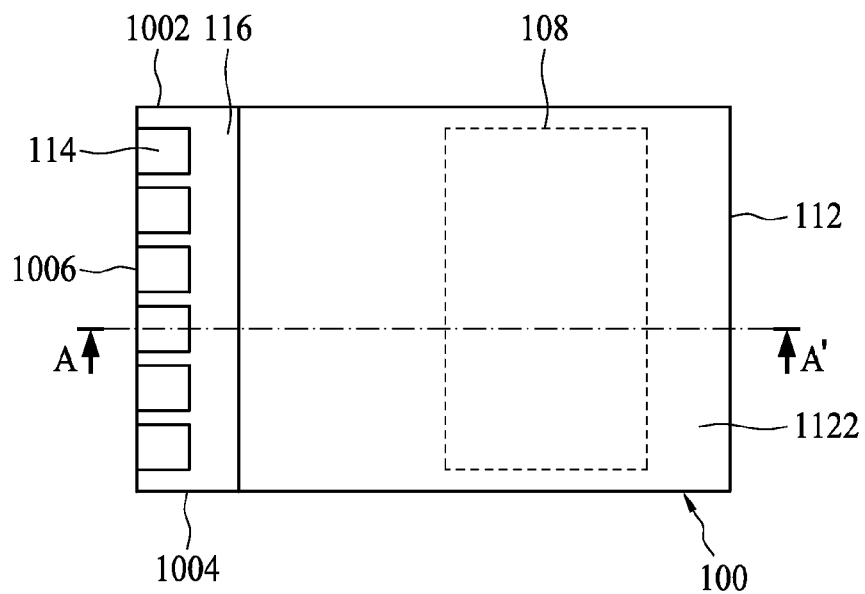

FIGS. 1A and 1B are different views of a semiconductor structure in accordance with some embodiments of the present disclosure. FIG. 1A is a cross-sectional view from line A-A' of a semiconductor structure 10 in FIG. 1B in accordance with some embodiments of the present disclosure.

Referring to FIG. 1A, a micro electromechanical system (MEMS) device 100 is provided. The MEMS device 100 includes a substrate 102 for bearing additional components thereon. The substrate 102 is a substrate or carrier including a MEMS device or component providing a portion thereof. In some embodiments, the substrate 102 is in wafer form. In certain embodiments, the substrate 102 includes at least one moveable component. In certain embodiments, the substrate 102 includes some CMOS active devices and/or passive devices.

An isolative layer 104 is formed over the substrate 102 and around a conductor 106. In addition to provide isolation for the conductor 106, the isolative layer 104 serves to separate the substrate 102 from the components thereon. The isolative layer 104 is, for example, a polymer layer. The polymer layer is formed of a polymer material such as an epoxy, polyimide, benzocyclobutene (BCB), polybenzoxazole (PBO), and the like, although other relatively soft, often organic, dielectric materials can also be used. In some embodiments, the isolative layer 104 is formed of a non-organic material selected from un-doped silicate glass (USG), silicon nitride, silicon oxynitride, silicon oxide, and combinations thereof. The formation methods of the isolative layer 104 include spin coating or other methods. In certain embodiments, exemplary materials of the isolative layer 104 include, TEOS, SiN, oxide, and/or other suitable materials.

In some embodiments in accordance with the present disclosure, the conductor 106 includes suitable material such as gold, copper (Cu), indium (In), aluminum (Al), Tin (Sn), germanium (Ge), titanium (Ti), tungsten (W), palladium (Pd), nickel (Ni) and silicon (Si), and proper combinations thereof. In some embodiments, the conductor 106 includes a material suitable for providing an electrical connection and/or forming a eutectic bond. In certain embodiments, the conductor 106 includes a plurality of layers (e.g., liners). Different layers are electrically connective through vias.

An electromechanical component 108, at least a first type electrical terminal 110 of the MEMS device 100, a second type electrical terminal 112 of the MEMS device 100, and a semiconductor interconnector 114 are disposed over the isolative layer 104. At least two poles of the electromechanical component 108 are configured to be electrically connected to the first type electrical terminal 110 and the second type electrical terminal 112 respectively. In certain embodiments, different functions of the electromechanical component 108 requires that the first type electrical terminal 110 and the second type electrical terminal 112 connected to a same pole. Therefore, the first type electrical terminal 110 and the second type electrical terminal 112 have a same positive potential, negative potential, or zero potential (grounded). Alternatively, different potentials are connected to the first type electrical terminal 110 and the electromechanical component 108. In some embodiments, the semiconductor interconnector 114 serves as an outlet to lead electrical signals out of the semiconductor structure 10 from the first type electrical terminal 110 and the second type electrical terminal 112. In addition, the first type electrical terminal 110 and the second type electrical terminal 112 are separated. The second type electrical terminal 112 is configured to surround the first type electrical terminal 110 and the electromechanical component 108. In some embodiments, the second type electrical terminal 112 includes a cap 1122 at least partially encapsulating the first type electrical terminal 110 and the electromechanical component 108. In addition, the second type electrical terminal 112 is interposed between the first type electrical terminal 110 and the semiconductor interconnector 114. However, the semiconductor interconnector 114 is not covered by the cap 1122.

In some embodiments in accordance with the present disclosure, the electromechanical component 108 is fabricated on the substrate 102 or fabricated and subsequently coupled (e.g., bonded) to the substrate 102. Exemplary electromechanical components 108 include components forming a motion sensor (for example, a gyroscope or an accelerometer, a resonator, an RF MEMS device (for example, an RF switch or filter), an oscillator, a MEMS microphone, a bio MEMS, and/or any other later developed Electromechanical components. In certain embodiments, the electromechanical component 108 includes a moveable component formed in a micro-scale (e.g., 1 to 1000 μm in size). The electromechanical component 108 as referred to herein does not necessitate a final, functional component but a portion thereof, such as any component providing mechanical movement.

In some embodiments in accordance with the present disclosure, the first type electrical terminal 110 and the second type electrical terminal 112 are connected to different poles of the electromechanical component 108. In other words, the first type electrical terminal 110 is configured as a first electrode of the MEMS device 100 and the second type electrical terminal 112 is configured as a second electrode of the MEMS device 100. Accordingly, electrical signals are to be transmitted between the MEMS device 100 and an external circuitry (not depicted) through the first type electrical terminal 110 and/or the second type electrical terminal 112. In certain embodiments, for different functions of electromechanical components 108, the first type electrical terminal 110 and the second type electrical terminal 112 is connected and serves the same function. Therefore, electrical signals from the first type electrical terminal 110 and the second type electrical terminal 112 is configured to be transmitted outside the semiconductor structure 10 through the semiconductor interconnector 114 via the conductor 106. It is to be noted that the different electrical connections and signal transmissions between the electromechanical components 108, the first type electrical terminal 110 and the second type electrical terminal 112 are within the contemplated scope of the present disclosure.

In some embodiments in accordance with the present disclosure, the semiconductor interconnector 114 is electrically connected with the first type electrical terminal 110 through the conductor 106. One end of the conductor 106 is connected with the first type electrical terminal 110 and the other end of the conductor 106 is connected with the semiconductor interconnector 114. Accordingly, electrical signals are able to be transmitted between the electromechanical component 108 and the semiconductor interconnector 114 through the first type electrical terminal 110. Moreover, electrical signals are able to be transmitted between the electromechanical component 108 and an external circuitry (not depicted) through the semiconductor interconnector 114. Due to the separation of the second type electrical terminal 112 from the first type electrical terminal 110 and from the semiconductor interconnector 114, cross-talking or shortage is prevented between the second type electrical terminal 112 and the first type electrical terminal 110. In certain embodiments, the first type electrical terminal 110 and the second type electrical terminal 112 shares a same potential. Therefore, the semiconductor interconnector 114 serves as an I/O interface for both the first type electrical terminal 110 and the second type electrical terminal 112.

In some embodiments in accordance with the present disclosure, at least one side of the semiconductor interconnector 114 is at one outer boundary of the MEMS device 100. In certain embodiments, the semiconductor interconnector 114 is disposed at one end of the MEMS device 100. In addition, the semiconductor interconnector 114 is separated from the second type electrical terminal 112. The semiconductor interconnector 114 is separated from the second type electrical terminal 112 with a space filled by air, serving as a, e.g., dielectric or insulator. In certain embodiments, the semiconductor interconnector 114 is separated from the second type electrical terminal 112 by an insulator (not depicted) filling the space between the semiconductor interconnector 114 and the second type electrical terminal 112. The insulator serves to prevent electrical signals from transmitting between the semiconductor interconnector 114 and the second type electrical terminal 112. In other words, the insulator serves to prevent a shortage between the semiconductor interconnector 114 and the second type electrical terminal 112 at the MEMS device 100. The insulator is made of non-conductive material. In certain embodiments, the insulator includes a molding compound.

In other words, at least one side of the semiconductor interconnector 114 is at one outer boundary of the MEMS device 100.

In some embodiments in accordance with the present disclosure, the external circuitry (not depicted) electrically connected with the MEMS device 100 is a complementary metal-oxide-semiconductor (CMOS) device. In certain embodiments, the external circuitry includes electrical devices such as various N-type metal-oxide semiconductor (NMOS) and/or P-type metal-oxide semiconductor (PMOS) devices. In addition, the external circuitry includes transistors, capacitors, resistors, diodes, photo-diodes, fuses, and the like, interconnected to perform one or more functions. The functions include memory structures, processing structures, sensors, amplifiers, power distribution, input/output circuitry, or the like. In some embodiments, the external circuitry includes various layers and features that can combine to form various microelectronic elements that may include: transistors (for example, metal-oxide-semiconductor field effect transistors (MOSFET) including complementary metal-oxide-semiconductor (CMOS) transistors, bipolar junction transistors (BJT), high voltage transistors, high frequency transistors, p-channel and/or n-channel field effect transistors (PFETs/NFETs)); resistors; diodes; capacitors; inductors; fuses; and/or other suitable elements. The microelectronic elements could be interconnected to one another to form a portion of an integrated circuit device, such as a logic device, memory device (for example, a static random access memory (SRAM)), radio frequency (RF) device, input/output (I/O) device, system-on-chip (SoC) device, other suitable types of devices, or combinations thereof. In some embodiments, the external circuitry includes an integrated circuit device (or portion thereof) designed and formed by CMOS based processes. A substrate including a device formed using other integrated circuit fabrication technologies is also within the scope of the present disclosure. In certain embodiments, the substrate 102 includes an external circuitry. In some embodiments, the substrate 102 includes a CMOS device (not depicted). Through the vias and electrical wires (such as the conductor 106) at the isolative layer 104, electrical signals from the CMOS device is transmitted outside the semiconductor structure 10 through the semiconductor interconnector 114. One of ordinary skill in the art will appreciate that the above examples are provided for illustrative purposes only to further explain applications of some illustrative embodiments and are not meant to limit the disclosure in any manner.

In some embodiments in accordance with the present disclosure, the semiconductor interconnector 114 includes silicon material. In addition, the semiconductor interconnector 114 and the cap 1122 are made of a same material.

Referring to FIG. 1B, in some embodiments in accordance with the present disclosure, a semiconductor structure 10 including a MEMS device 100 is provided. The MEMS device 100 includes a cap 1122 over an electromechanical component 108. The electromechanical component 108 is electrically connected with a semiconductor interconnector 114, which is not covered by the cap 1122. In other words, the semiconductor interconnector 114 is configured as an electrical terminal of the electromechanical component 108. Therefore, electrical signals can be transmitted between the electromechanical component 108 and an external circuitry (not depicted) through the semiconductor interconnector 114.

In some embodiments in accordance with the present disclosure, the semiconductor interconnector 114 is disposed at one end of the MEMS device 100. In addition, the semiconductor interconnector 114 and the cap 1122 is separated by an insulator 116. The insulator 116 extends in a first direction and ends at an outer boundary of the MEMS device 100. Accordingly, an outlet of the insulator 116 is formed at an outer boundary of the MEMS device 100. In certain embodiments, two outlets are formed at different outer boundaries of the MEMS device 100. For example, with reference to FIG. 1B, two outlets of the insulator 116 is formed at outer boundaries 1002, 1004 of the MEMS device 100.

In some embodiments in accordance with the present disclosure, the first direction is substantially parallel with an outer boundary 1006 of the MEMS device 100. For example, the first direction extends from the outer boundary 1002 to the opposite outer boundary 1004 of the MEMS device 100. In some embodiments, the insulator further extends in a second direction. The second direction is not parallel with the first direction. For example, with reference to FIG. 1B, the second direction is substantially perpendicular to the first direction. In addition, one or more outlet is formed at the outer boundary 1006 of the MEMS device 100.

In some embodiments in accordance with the present disclosure, several semiconductor interconnectors 114 are provided at an outer boundary of the MEMS device 100. For example, with reference to FIG. 1B, several semiconductor interconnectors 114 are formed at the outer boundary 1006 of the MEMS device 100. The semiconductor interconnectors 114 are separated from each other by the insulator 116. Each extension of the insulator 116 extending in the second direction serves to separate each semiconductor interconnector 114 from nearby semiconductor interconnector(s) 114. In addition, the extension of the insulator 116 extending in the second direction serves to separate the semiconductor interconnectors 114 from the cap 1122. Accordingly, the semiconductor interconnectors 114 are separated from each other and the cap 1122 by the insulator 116.

In some embodiments in accordance with the present disclosure, the insulator 116 includes a molding compound. The molding compound serves to prevent electrical signals from being transmitted between the semiconductor interconnectors 114 and the cap 1122. In certain embodiments, the insulator 116 includes a mixture of air and molding compound or a space filled with air. Insulator 116 of other compositions is within the contemplated scope of the present disclosure.

Figure 2A:
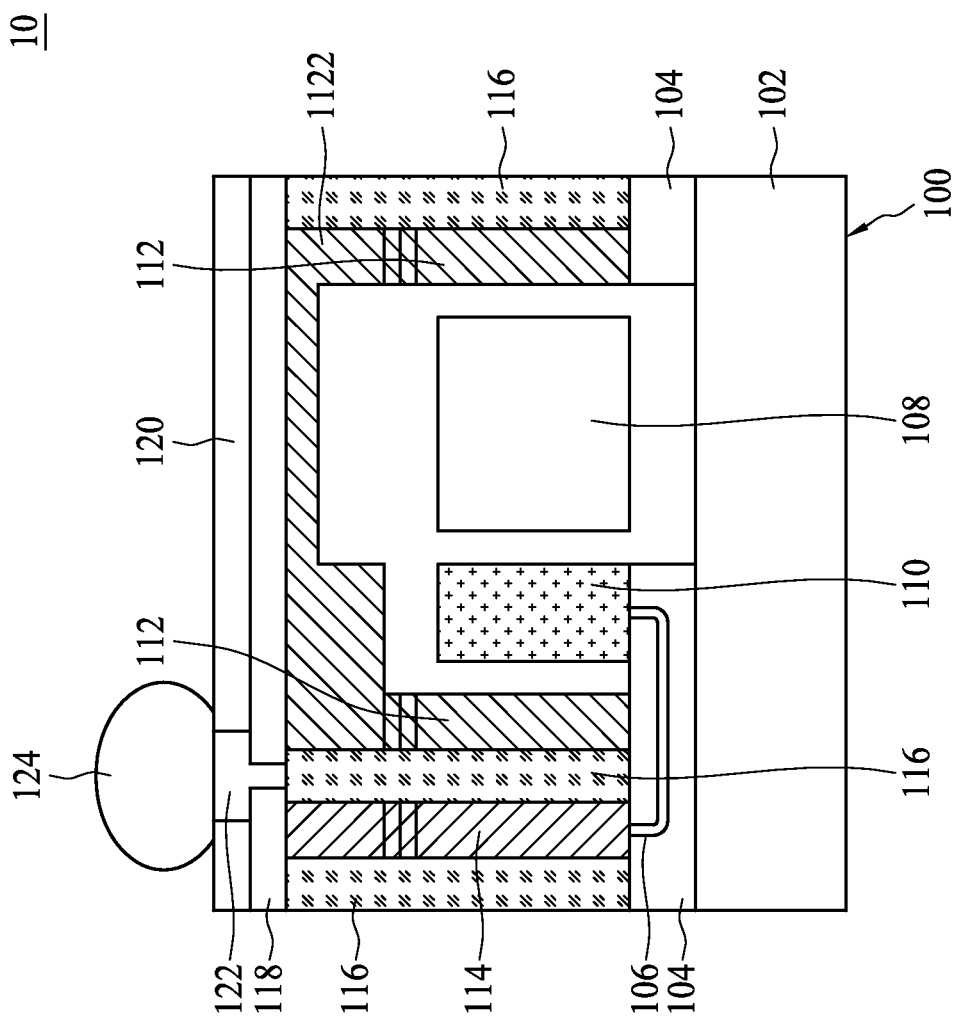
FIGS. 2A-2C are cross-sectional views of a semiconductor structure in accordance with some embodiments of the present disclosure.
Figure 2B:
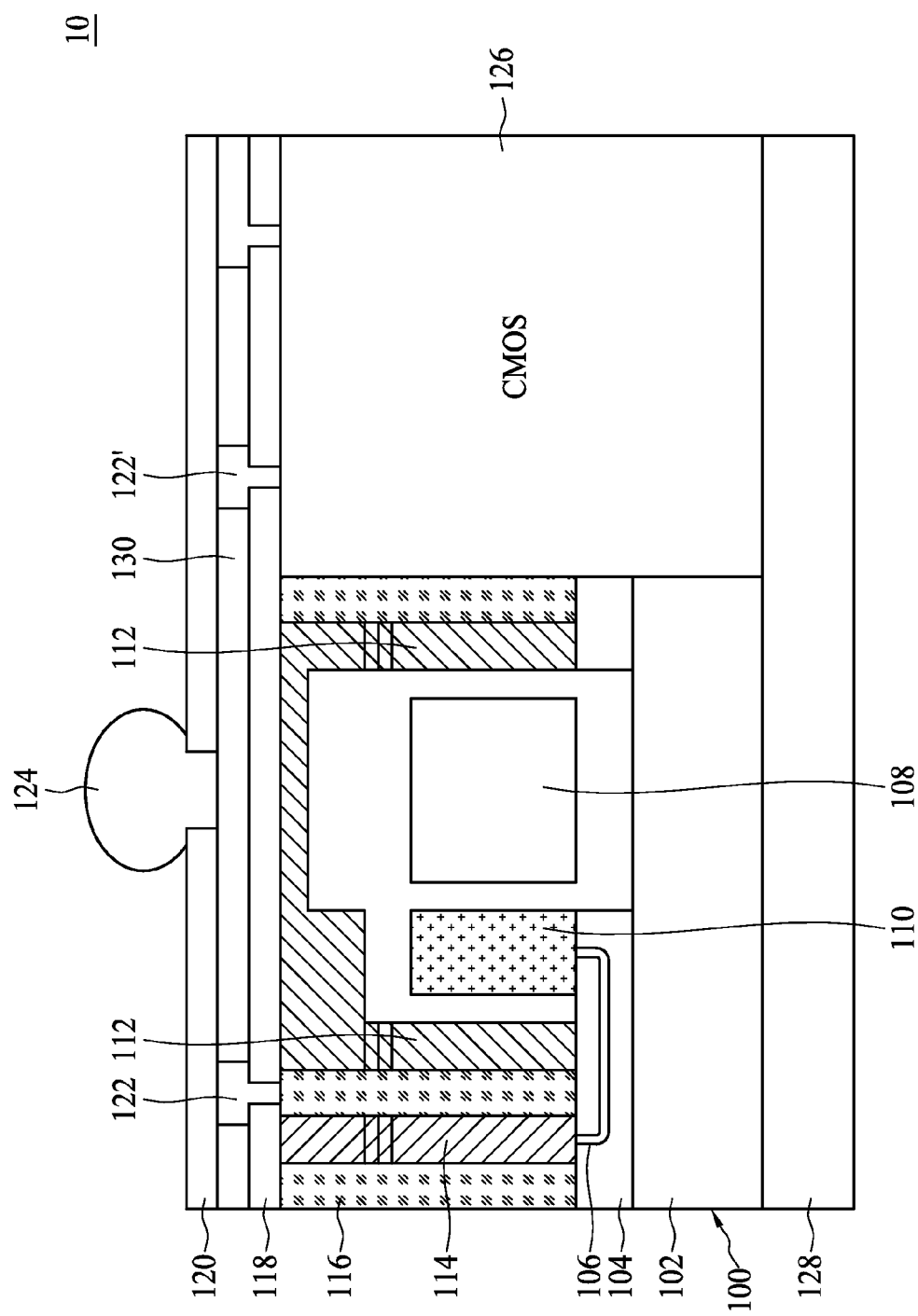
Figure 2C:
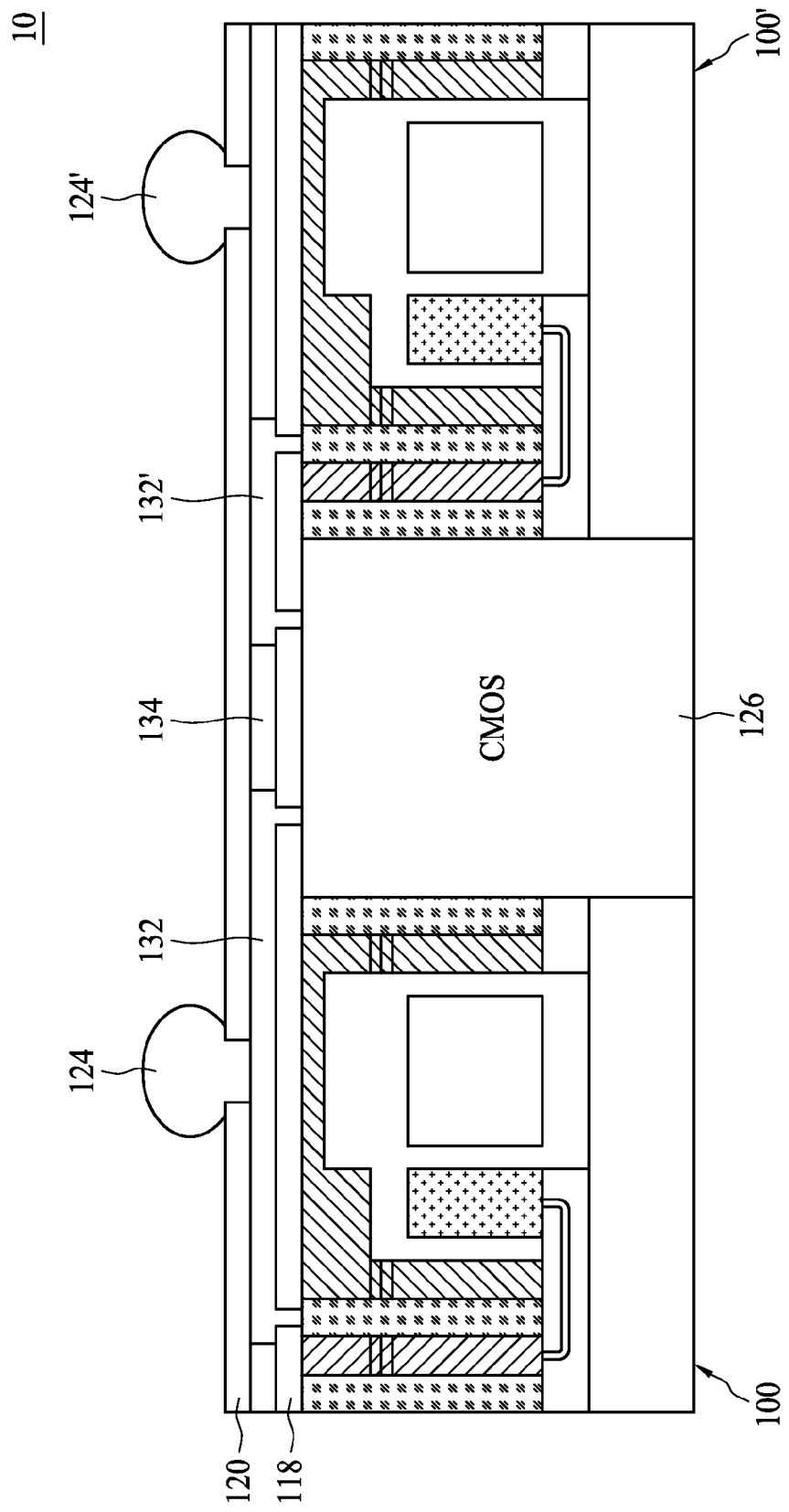

FIGS. 2A-2C are cross-sectional views of a semiconductor structure in accordance with some embodiments of the present disclosure.

Referring to FIG. 2A, a semiconductor structure 10 including a MEMS device 100 is provided. With reference to FIG. 1A, the MEMS device includes a substrate 102 under an isolative layer 104. The isolative layer 104 surrounds a conductor 106 which serves to electrically connect a first type electrical terminal 110 of an electromechanical component 108 and a semiconductor interconnector 114. In addition, a cap 1122 of the second style electrical terminal 112 is configured to cover the electromechanical component 108 and the first type electrical terminal 110. Moreover, the electromechanical component 108 includes a second type electrical terminal 112 at least partially surrounding the first type electrical terminal 110 and the electromechanical component 108. The second type electrical terminal 112 is also interposed between the semiconductor interconnector 114 and the first type electrical terminal 110.

In some embodiments in accordance with the present disclosure, an insulator 116 is configured to surround the semiconductor interconnector 114. The insulator includes a molding compound which serves to prevent electrical signals from transmitting between the second type electrical terminal 112 and the semiconductor interconnector 114. In other words, the semiconductor interconnector 114 is separated from the cap 1122 by the insulator 116.

In some embodiments in accordance with the present disclosure, additional layers are formed over the cap 1122, the semiconductor interconnector 114 and the insulators 116 so as to package the MEMS device 100 into a circuitry. For example, a passivation 118 is provided. The passivation 118 is formed of a dielectric material, such as undoped silicate glass (USG), silicon nitride, silicon oxide, silicon oxynitride or a non-porous material by any suitable method, such as CVD, PVD, or the like. In some embodiments, the passivation 118 is a single layer or a laminated layer. In some embodiments, the passivation 118 includes a polymer material. One of ordinary skill in the art will appreciate that a single layer of passivation is shown for illustrative purposes only. As such, other embodiments can include any number of conductive layers and/or passivations. The passivation 118 is then patterned by the use of masking methods, lithography technologies, etching processes, or combinations thereof, such that a portion of the semiconductor interconnector 114 is exposed.

In some embodiments in accordance with the present disclosure, a dielectric 120 is formed on the passivation 118. In some embodiments, the dielectric 120 is patterned to have an opening exposing a portion of the semiconductor interconnector 114. The dielectric 120 can be, for example, a polymer layer. The polymer layer can be formed of a polymer material such as an epoxy, polyimide, benzocyclobutene (BCB), polybenzoxazole (PBO), and the like, although other relatively soft, often organic, dielectric materials can also be used. In some embodiments, the dielectric 120 is formed of a non-organic material selected from un-doped silicate glass (USG), silicon nitride, silicon oxynitride, silicon oxide, and combinations thereof. The formation methods of the dielectric 120 include spin coating or other methods. In some embodiments, the dielectric 120 is an optional layer, which can be skipped in the semiconductor structure 10.

In some embodiments in accordance with the present disclosure, a connector 122 is provided so as to contact the semiconductor interconnector 114. The connector 122 is a conductive bump, a conductive via, or any suitable structure or material. Accordingly, the connector 122 serves to provide external electrical connections. A bump 124 is provided over the connector 122. Through the connector 122, the bump 124 is electrically connected to the semiconductor interconnector 114. In certain embodiments, the bump 124 is a Cu bump or a metal bump including Ni or Au. In some embodiments, the bump 124 is formed by disposing a solder ball and then thermally reflowing the solder ball. In some embodiments, the bump 124 includes a lead-free pre-solder layer, SnAg, or a solder material including alloys of tin, lead, silver, copper, nickel, bismuth, or combinations thereof. In some embodiments, the bump 124 is formed by plating a solder layer with photolithography technologies followed by reflowing processes. In some embodiments, the bump 124 includes "microbumps". In certain embodiments, the bump 124 is made of a magnetic or ferromagnetic material.

In some embodiments in accordance with the present disclosure, an external circuitry (not depicted) can transmit/receive electrical signals to and from the electromechanical component 108 of the MEMS device 100 through the semiconductor interconnector 114.

Referring to FIG. 2B, a semiconductor structure 10 including a MEMS device 100 electrically connected to a CMOS device 126 is provided. The MEMS device 100 and the CMOS device 126 are provided on a handle substrate 128. Details of the MEMS device 100 have been presented in the previous paragraphs and will not be repeated. Over the MEMS device 100, a conductive trace 130 is formed. A connector 122' is provided over the CMOS device 126 so as to provide external electrical connections. Accordingly, the MEMS device 100 is electrically connected with the CMOS device 126 through the conductive trace 130. Electrical signals can be transmitted out of the semiconductor structure 10 through the bump 124. In some embodiments, the connector 122, the conductive trace 130 and the connector 122' are formed in a same stage. For example, the connector 122, the conductive trace 130 and the connector 122' are within one layer or re-distribution line (RDL) over the passivation 118. Other suitable formations and configurations of connector 122, the conductive trace 130 and the connector 122' are within the contemplated scope of the present disclosure.

Referring to FIG. 2C, a semiconductor structure 10 including two MEMS devices 100, 100' electrically connected to a CMOS device 126 is provided. Details of the MEMS devices 100, 100' have been presented in the previous paragraphs and will not be repeated. The first MEMS device 100 is electrically connected with the CMOS device 126 through a first conductive trace 132. The second MEMS device 100' is electrically connected with the CMOS device 126 through a second conductive trace 132'. In addition, the first conductive trace 132 and the second conductive trace 132' are separated by an isolative layer 134. Accordingly, the CMOS device 126 is electrically connected with more than one MEMS devices 100, 100'. In certain embodiments, a multiple MEMS devices with different functions are electrically connected to one CMOS device through structures similar to the semiconductor structure 10 disclosed herein.

Figure 3:
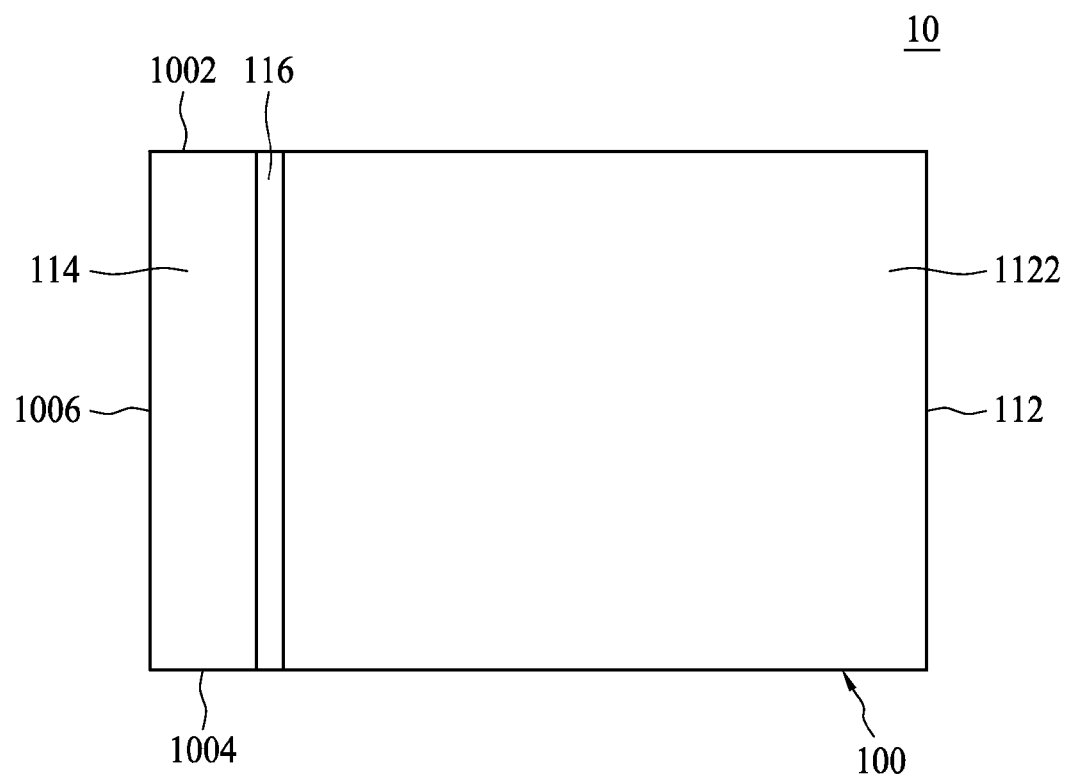
FIG. 3 is a top view of a semiconductor structure in accordance in accordance with some embodiments of the present disclosure.

FIG. 3 is a top view of a semiconductor structure-in accordance with some embodiments of the present disclosure.

Referring to FIG. 3, a semiconductor structure 10 including a MEMS device 100 is provided. The MEMS device 100 includes a cap 1122 over an electromechanical component (not depicted). The electromechanical component is electrically connected with a semiconductor interconnector 114, which is not covered by the cap 1122. In some embodiments, the semiconductor interconnector 114 is disposed at one end of the MEMS device 100. In addition, the semiconductor interconnector 114 and the cap 1122 is separated by an insulator 116. The insulator 116 extends in a first direction. The first direction extends from one outer boundary 1002 to another outer boundary 1004 of the MEMS device 100. As a result, outlets of the insulator 116 are formed at outer boundaries 1002, 1004 of the MEMS device 100. In certain embodiments, the first direction is substantially parallel with an outer boundary 1006 of the MEMS device 100.

In some embodiments in accordance with the present disclosure, at least one semiconductor interconnector 114 is provided. The semiconductor interconnector 114 is prolonged in shape and configured as one outer perimeter of the MEMS device 100. The insulator extends from one outer boundary 1002 to an opposite outer boundary 1004 so as to separate the semiconductor interconnector 114 from the cap 1122 of the second type electrical terminal 112. Detailed embodiments of the insulator 116 have been disclosed in the foregoing paragraphs and will not be repeated.

Figure 4:
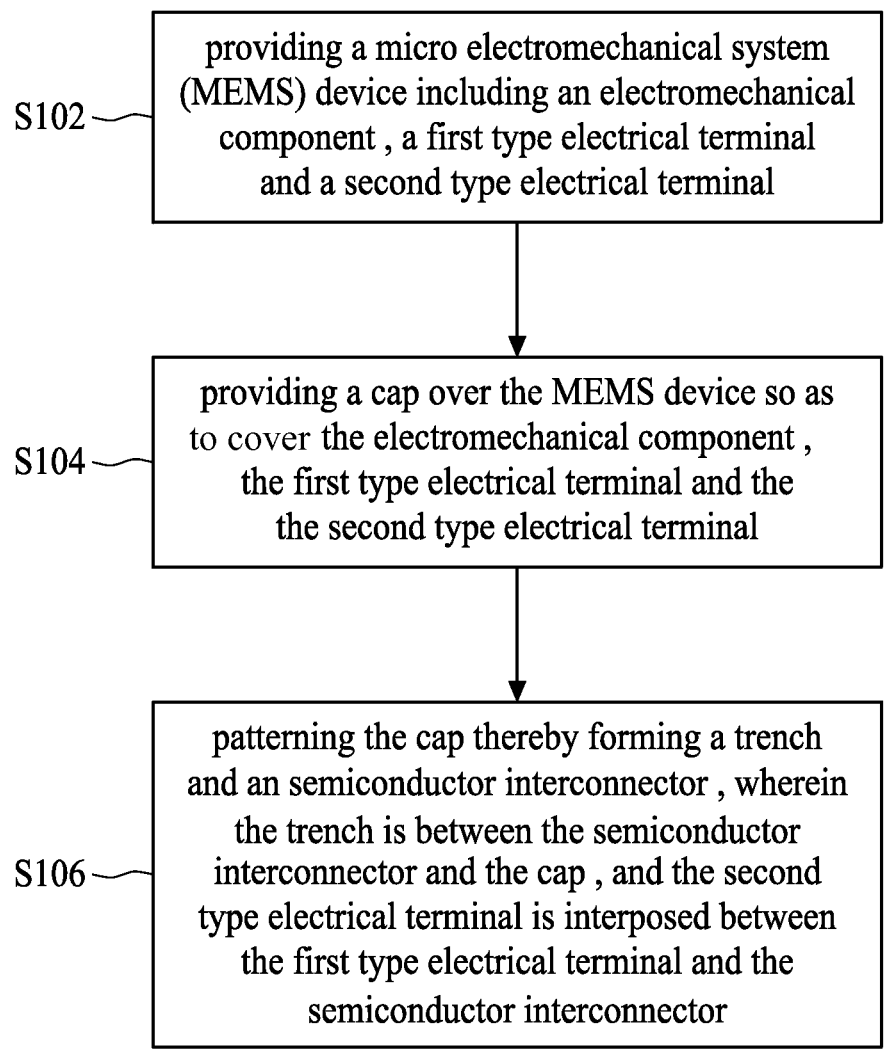
FIG. 4 is a flow diagram of a method for manufacturing semiconductor wafer in accordance with some embodiments of the present disclosure.

FIG. 4 is a flow diagram of a method for manufacturing semiconductor wafer in accordance with some embodiments of the present disclosure.

Referring to FIG. 4, in operation S102, a micro electromechanical system (MEMS) device is provided. The MEMS device includes an electromechanical component, a first type electrical terminal and a second type electrical terminal. In operation S104, a cap is provided over the MEMS device. The cap is configured to cover the electromechanical component, the first type electrical terminal and the second type electrical terminal. In operation S106, the cap is patterned. Accordingly, a trench and a semiconductor interconnector are formed. The trench is configured between the semiconductor interconnector and the cap. In addition, the second type electrical terminal is interposed between the first type electrical terminal and the semiconductor interconnector.

In some embodiments in accordance with the present disclosure, in one operation, the trench is filled with a molding compound. In one operation, extra molding compound is configured to escape from the MEMS device through the trench. In certain embodiments, the molding compound is lead out of the MEMS device through an outlet at an outer boundary of the trench. In some embodiments in accordance with the present disclosure, in one operation, a via is patterned at the cap. In one operation, a cavity is patterned at the cap. In certain embodiments, the via is greater in depth than the cavity.

In some embodiments in accordance with the present disclosure, in one operation, a molding compound is provided over the cap and the semiconductor interconnector. The molding compound further fills the trench so as to form an insulator between the cap and the semiconductor interconnector. In one operation, the molding compound is patterned so as to reveal the insulator. In one operation, a passivation is provided over the cap and the semiconductor interconnector. In one operation, the passivation is patterned so as to form a via exposing part of the semiconductor interconnector. In one operation, the via is filled so as to form a connector electrically connected with the semiconductor interconnector. In one operation, a bump is provided over the connector. The bump is electrically connected to the first type electrical terminal of the MEMS device through the semiconductor interconnector. Accordingly, electrical signals can be transmitted between the MEMS device and an external circuitry.

FIGS. 5A to 5I are cross-sectional views of an apparatus in various stages corresponding to the method of FIG. 4.

Figure 5A:
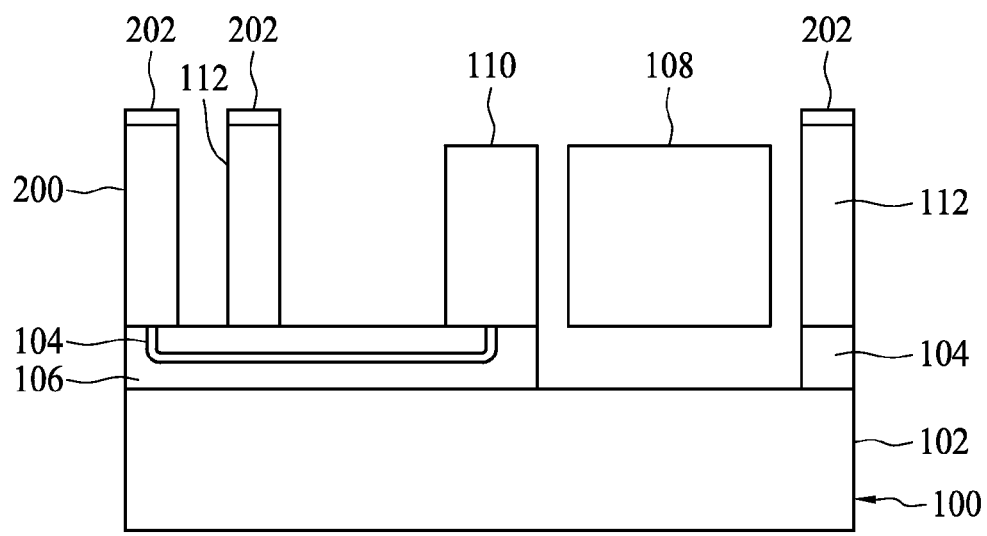
FIGS. 5A to 5I are cross-sectional views of an apparatus in various stages corresponding to the method of FIG. 4.

Referring to FIG. 5A, a micro electromechanical system (MEMS) device 100 is provided. The MEMS device includes a substrate 102 sustaining an electromechanical component 108. The MEMS device further includes an isolative layer 104 over the substrate 102 for encompassing a conductor 106 and supporting other components thereon. On top of the isolative layer 104, electrical terminal components are provided. The electrical terminal components include a first type electrical terminal 110 and one or more second type electrical terminal 112. In addition, a pillar 200 made of semiconductor material is provided over the isolative layer. The pillar is separated from the first type electrical terminal 110 and the one or more second type electrical terminal 112. The conductor 106 is configured to electrically connect the first type electrical terminal 110 and the pillar 200. Bonding pads 202 are formed over the first type electrical terminal 110, the one or more second type electrical terminal 112, and the pillar 200 for further operation.

Figure 5B:
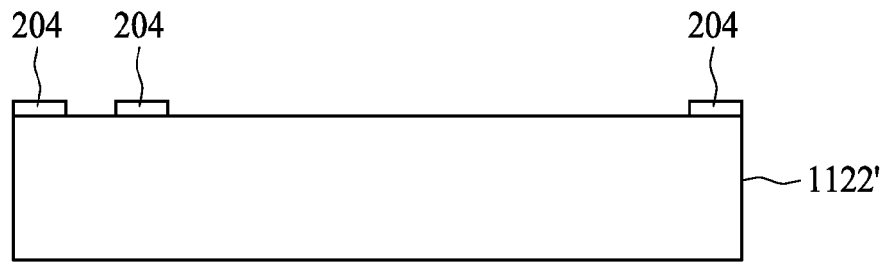

Referring to FIG. 5B, a cap substrate 1122' is provided. The cap substrate 1122' is configured to be flipped up side down so as to cover the MEMS device. Bonding pads 204 are formed over the cap substrate 1122' in order to be used in bonding procedures with the MEMS device in further operations.

In some embodiments in accordance with the present disclosure, the bonding pads are be formed by depositing a layer of conductive material and patterning the material to form a bonding feature. The bonding pads include suitable material such as gold, copper (Cu), indium (In), aluminum (Al), Tin (Sn), germanium (Ge), titanium (Ti), palladium (Pd), nickel (Ni) and silicon (Si), and proper combinations thereof. In certain embodiments, the bonding pads are formed by sputter, plating, physical vapor deposition (PVD), chemical vapor deposition (CVD), evaporation, electron beam evaporation (E-gun), ion beam, energy beam, combinations thereof, and/or other suitable deposition processes. In certain embodiments, the deposited material is patterned using photolithography and other suitable processes.

Figure 5C:
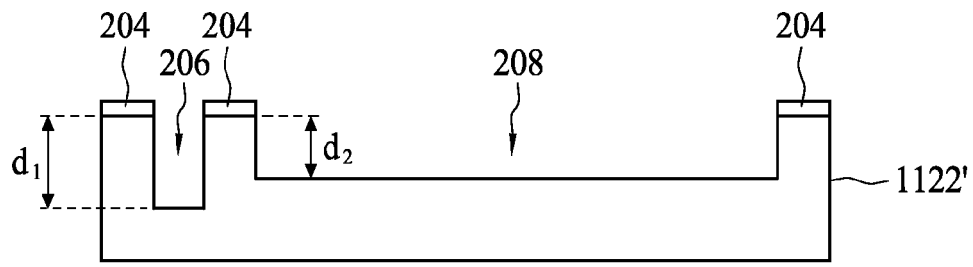

Referring to FIG. 5C, the cap substrate 1122' is patterned so as to form a via 206 and a cavity 208. The depth d1 of the via 206 is greater than the depth d2 of the cavity 208. In some embodiments, the via 206 and the cavity 208 is formed by separate operations of deep reactive ion etching (DRIE). In certain embodiments, a first photoresist agent is provided over the cap substrate 1122' and a photolithography is conducted to form the cavity 208. A second photoresist agent is then provided over the cap substrate 1122' and a photolithography is conducted to form the via 206. The order for forming cavity 208 and the via 206 can be swapped. In some embodiments, a first oxide mask is disposed on part of the cap substrate 1122' for the first stage etching. A preliminary via (not depicted) is formed having a height of d1-d2. A photoresist agent is then disposed on part of the cap substrate 1122' for the second stage etching. The designated parts of the cap substrate 1122' are etched for a depth of d2. Accordingly, the cavity 208 having a depth d2 and the via 206 having a depth d1 are formed at the cap substrate 1122'. In addition, other suitable patterning methods of the cap substrate 1122' are within the contemplated scope of the present disclosure. Due to the greater depth of the via 206 than that of the cavity 208, the cavity 208 is not revealed before the via 206 during a thin-down process of the cap substrate 1122'. In some embodiments, an aperture is formed at the cap substrate 1122' only through the via 206 at a thin-down process. In certain embodiments, the difference between the depth of the via 206 and the cavity 208 is between about 2 µm and about 500 µm.

Figure 5D:
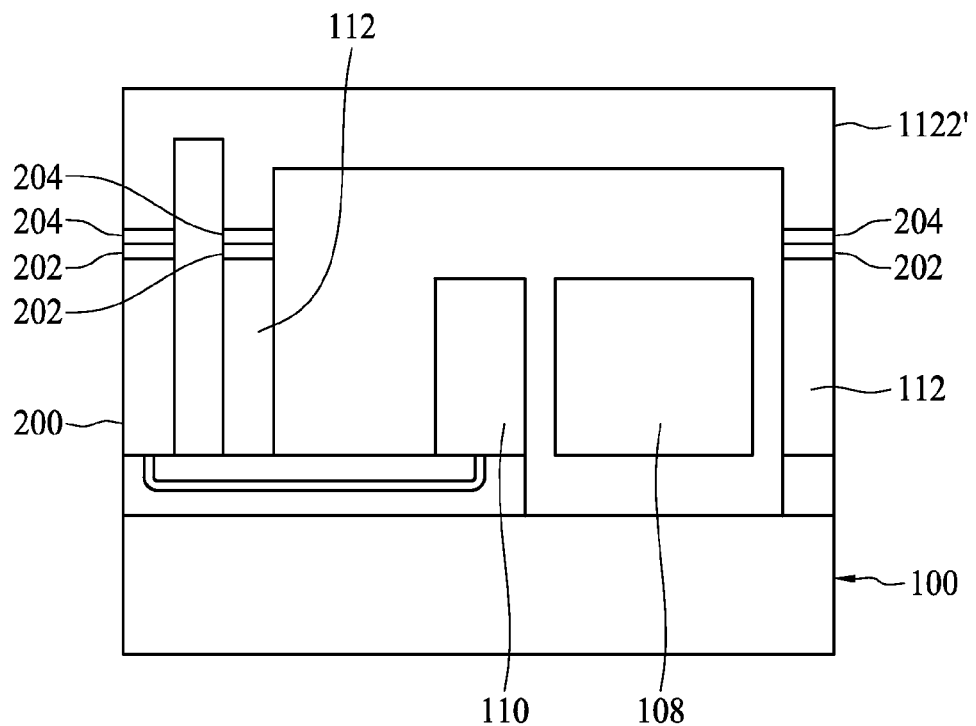

Referring to FIG. 5D, the cap substrate 1122' is flipped up side down so as to cover the MEMS device 100. Accordingly, the first type electrical terminal 110, the one or more second type electrical terminal 112, the electromechanical component 108 and the pillar 200 are covered by the cap substrate 1122'. The bonding pads 202 of the MEMS device 100 and the bonding pads 204 of the cap substrate 1122' are bonded so as to secure the MEMS device 100 and the cap substrate 1122' together.

In some embodiments in accordance with the present disclosure, the bonding pads 202, 204 are bonded using a eutectic bonding process, though other techniques are possible. The eutectic reaction is achieved by heating the connective elements or bonding layer(s) to their eutectic temperature, the temperature at which a combination of the connective elements or bonding layers initially forms a liquid or molten state (eutectic state). The materials at the interface of the connective elements or bonding layers then diffuse together to form an alloy composition or a eutectic alloy layer. Alternatively, the bonding between the substrates is achieved by thermal compressive bonding, thermal diffusion bonding, and/or other suitable manners. In certain embodiments, the bonding process is performed in the presence of a forming gas and/or another controllable environment. Exemplary forming gases include argon, nitrogen (N2), hydrogen (H2), nitrogen/hydrogen mixture, and/or other suitable gases. In some embodiments, a surface clean is performed prior to the bonding process. The surface clean includes a wet etch (e.g., HF), a dry etch (e.g., argon sputtering and plasma etch processes), or combinations thereof. In addition, the bonding is performed by a commercially available wafer bonder, and an alignment process is typically performed prior to the bonding process.

Figure 5E:
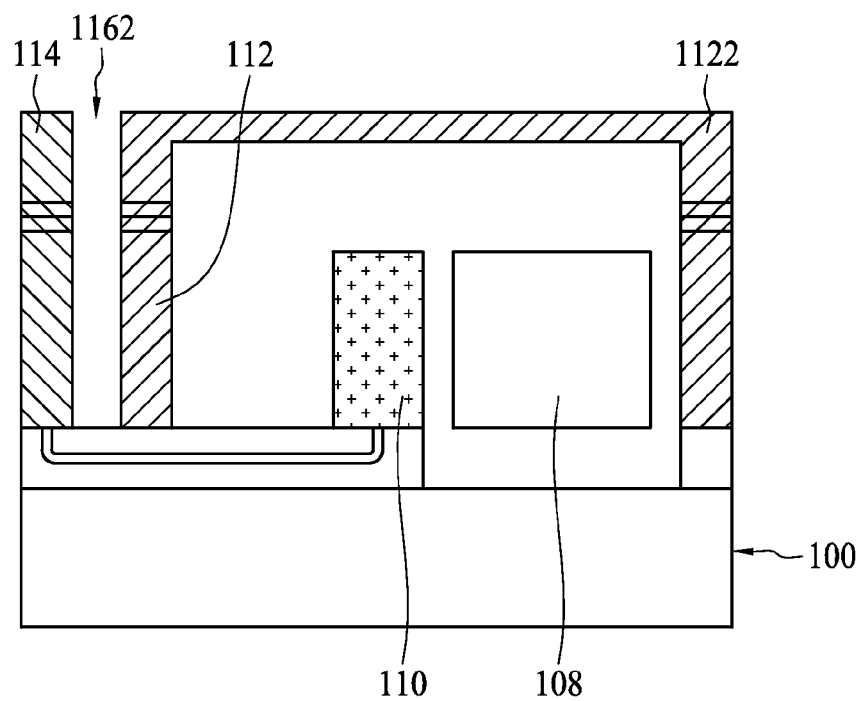

Referring to FIG. 5E, the cap substrate 1122' is patterned so as to form a trench 1162, a semiconductor interconnector 114, and a second type electrical terminal 112 surrounding the first type electrical terminal 110 and the electromechanical component 108. In some embodiments, the cap substrate 1122' is thinned down to form a cap 1122 of the second type electrical terminal 112. One end of the second type electrical terminal 112 is interposed between the first type electrical terminal 110 and the semiconductor interconnector 114. The trench 1162 is between the second type electrical terminal 112 and the cap 1122. In addition, the trench 1162 is configured to separate the semiconductor interconnector 114 from the second type electrical terminal 112. In certain embodiments, the trench 1162 serves as an insulator between the semiconductor interconnector 114 from the second type electrical terminal 112 to prevent electrical signals from being transmitted therebetween.

In some embodiments in accordance with the present disclosure, the cap substrate 1122' is thinned down by a grinding process. Other suitable patterning methods of the cap substrate 1122' are within the contemplated scope of the present disclosure.

Figure 5F:
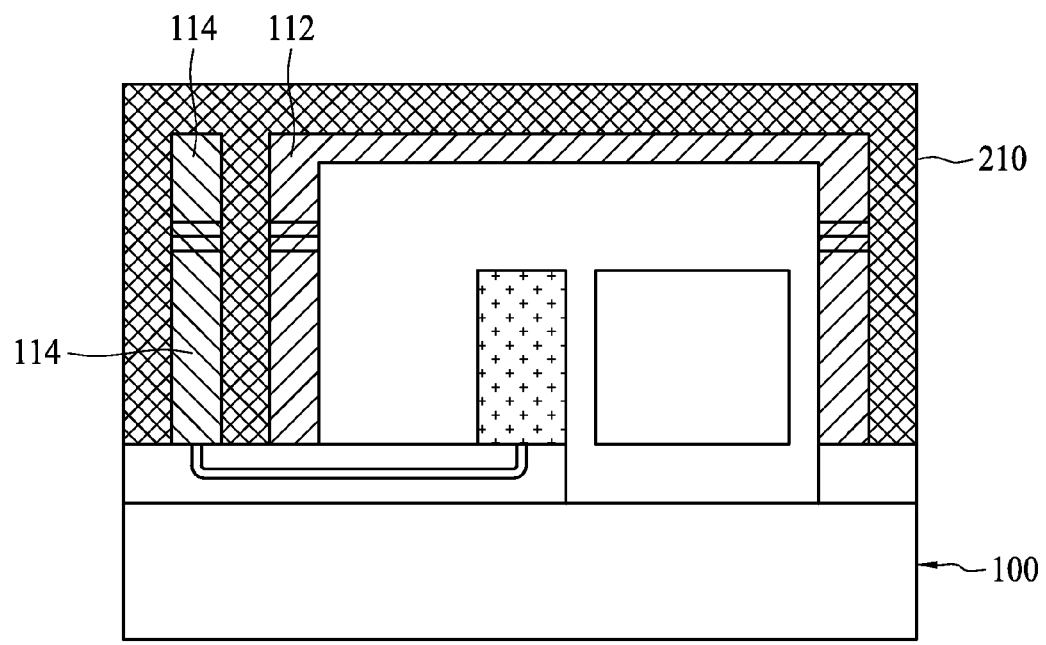

Referring to FIG. 5F, molding compound 210 is provided around the MEMS device 100. The molding compound surrounds the semiconductor interconnector 114. In addition, the trench 1162 (with reference to FIG. 5E) is filled with molding compound 210 such that no electrical signals can be transmitted between the semiconductor interconnector 114 from the second type electrical terminal 112. In certain embodiments, the molding compound 210 serves as an insulator between the semiconductor interconnector 114 and the second type electrical terminal 112.

In some embodiments in accordance with the present disclosure, extra molding compound 210 is configured to escape the MEMS device 100 through the trench 1162. In certain embodiments, the trench 1162 has one or more exit at the outer boundary (with reference to FIG. 1B) of the MEMS device such that excess molding compound flows away from the MEMS device 100 through such one or more exit.

Figure 5G:
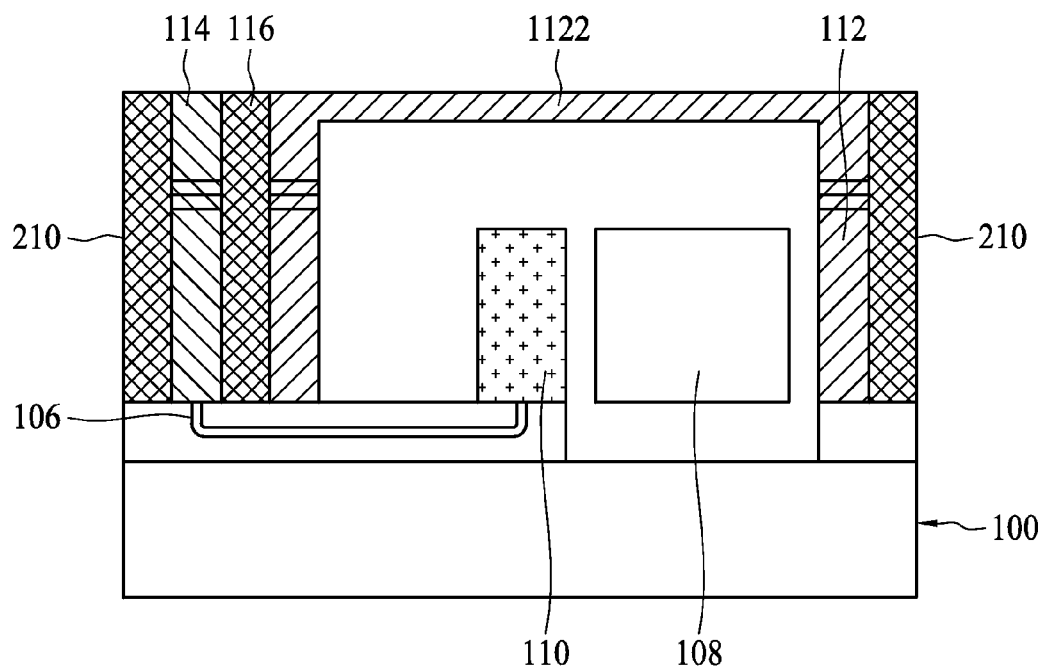

Referring to FIG. 5G, the molding compound 210 is patterned to reveal one side of the semiconductor interconnector 114, the cap 1122 of the second type electrical terminal 112, and the insulator 116. No electrical signal transmissions between the semiconductor interconnector 114 and the second type electrical terminal 112 are allowed due to the insulator 116. However, the electromechanical component 108 can still transmit electrical signals out of the MEMS device 100 due to the electrical connection between the first type electrical terminal and the semiconductor interconnector 114 through the conductor 106. In some embodiments, the method for patterning the molding compound 210 includes grinding. Other suitable patterning methods of the molding compound 210 are within the contemplated scope of the present disclosure.

Figure 5H:
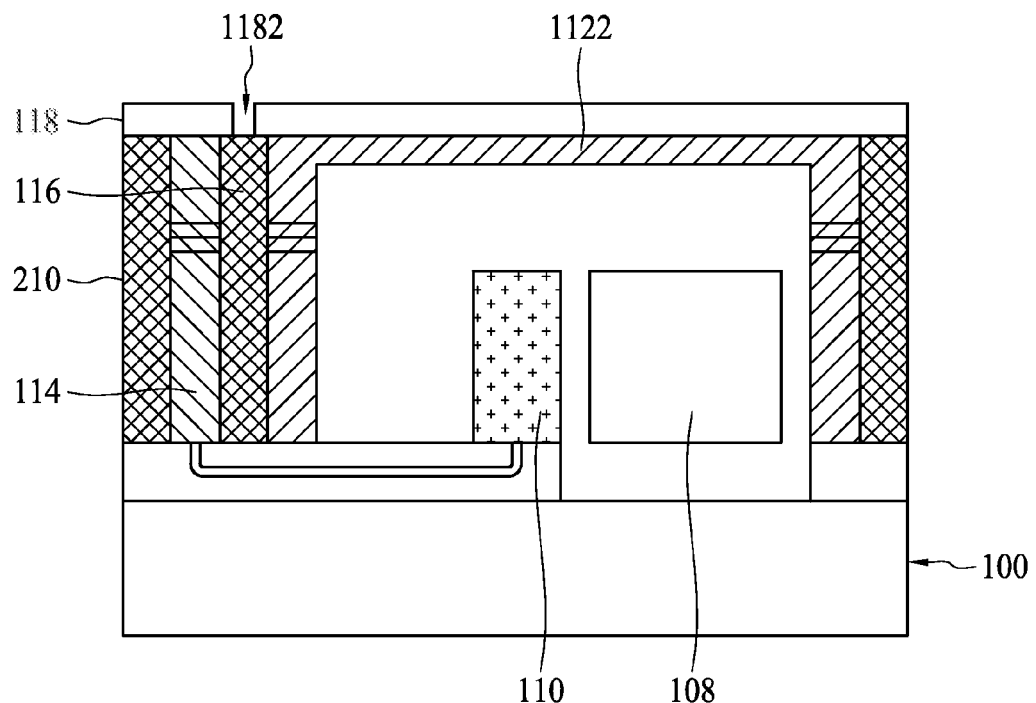

Referring to FIG. 5H, a passivation 118 is provided over the MEMS device 100. In other words, the passivation 118 is formed on top of the molding compound 210, the semiconductor interconnector 114, the insulator 116 and the cap 1122. In addition, the passivation 118 is patterned to form a via 1182 by the use of masking methods, lithography technologies, etching processes, or combinations thereof. The via 1182 is configured to expose at least part of the semiconductor interconnector 114.

In some embodiments in accordance with the present disclosure, the passivation 118 is formed of a dielectric material, such as undoped silicate glass (USG), silicon nitride, silicon oxide, silicon oxynitride or a non-porous material by any suitable method, such as CVD, PVD, or the like. In certain embodiments, the passivation 118 is a single layer, a laminated layer or a polymer layer. One of ordinary skill in the art will appreciate that a single layer of passivation is shown for illustrative purposes only. As such, other embodiments can include any number of conductive layers and/or passivations.

Figure 5I:
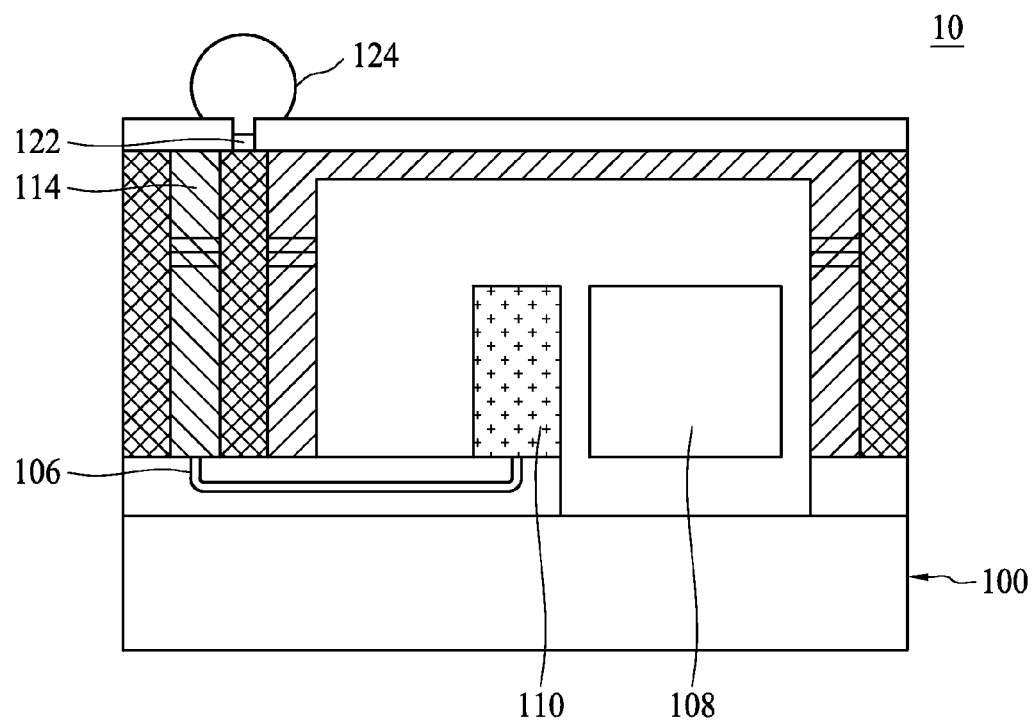

Referring to FIG. 5I, the via 1182 (with reference to FIG. 5H) is filled with a connector 122 electrically connected with the semiconductor interconnector 114. In addition, a bump 124 is provided. Through the connector 122, the bump 124 is electrically connected with the semiconductor interconnector 114. In some embodiments, the bump 124 is a Cu bump or a metal bump including Ni or Au. In certain embodiments, the bump 124 is formed by disposing a solder ball and then thermally reflowing the solder ball. In some embodiments, the solder 124 includes a lead-free pre-solder layer, SnAg, or a solder material including alloys of tin, lead, silver, copper, nickel, bismuth, or combinations thereof. In some embodiments, the bump 124 is formed by plating a solder layer with photolithography technologies followed by reflowing processes. In some embodiments, the bump 124 includes "microbumps". In certain embodiments, the bump 124 is made of a magnetic or ferromagnetic material.

In some embodiments in accordance with the present disclosure, the bump 124, the connector 122, the semiconductor interconnector 114, the conductor 106, the first type electrical terminal 110 and the electromechanical component 108 are electrically connected. Accordingly, the MEMS device 100 of the semiconductor structure 10 provided is able to transmit electrical signals to external circuitries (not depicted) through the semiconductor interconnector 114. Exemplary external circuitry includes a complementary metal-oxide-semiconductor (CMOS) device, but it is not so limited. In certain embodiments, the external circuitry includes electrical devices such as various N-type metal-oxide semiconductor (NMOS) and/or P-type metal-oxide semiconductor (PMOS) devices. In addition, the external circuitry includes transistors, capacitors, resistors, diodes, photo-diodes, fuses, and the like, interconnected to perform one or more functions. The functions include memory structures, processing structures, sensors, amplifiers, power distribution, input/output circuitry, or the like. In some embodiments, the external circuitry includes various layers and features that can combine to form various microelectronic elements that include: transistors (for example, metal-oxide-semiconductor field effect transistors (MOSFET) including complementary metal-oxide-semiconductor (CMOS) transistors, bipolar junction transistors (BJT), high voltage transistors, high frequency transistors, p-channel and/or n-channel field effect transistors (PFETs/NFETs)); resistors; diodes; capacitors; inductors; fuses; and/or other suitable elements. The microelectronic elements could be interconnected to one another to form a portion of an integrated circuit device, such as a logic device, memory device (for example, a static random access memory (SRAM)), radio frequency (RF) device, input/output (I/O) device, system-on-chip (SoC) device, other suitable types of devices, or combinations thereof. In some embodiments, the external circuitry includes an integrated circuit device (or portion thereof) designed and formed by CMOS based processes. A substrate including a device formed using other integrated circuit fabrication technologies is also within the scope of the present disclosure. One of ordinary skill in the art will appreciate that the above examples are provided for illustrative purposes only to further explain applications of some illustrative embodiments and are not meant to limit the disclosure in any manner. In certain embodiments, the MEMS device 100 includes a CMOS device. Through the vias and electrical wires (such as the conductor 106) at the isolative layer 104, the electromechanical component 108 is electrically connected to the CMOS device. Accordingly, electrical signals from the CMOS device is transmitted out of the MEMS device 100 through the semiconductor interconnector 114, the connector 122 and the bump 124.

In some embodiments, a semiconductor structure including a micro electromechanical system (MEMS) device is provided. The MEMS device includes a first type electrical terminal, which is connected with an external circuitry through a semiconductor interconnector. The semiconductor interconnector is electrically connected with the first type electrical terminal through a conductor. The MEMS device further includes a second type electrical terminal surrounding the first type electrical terminal. In addition, the second type electrical terminal is interposed between the semiconductor interconnector and the first type electrical terminal. Moreover, the MEMS device includes an isolative layer around the conductor. The isolative layer is configured under the first type electrical terminal, the second type electrical terminal and the semiconductor interconnector to provide support thereon.

In some embodiments, the semiconductor structure further includes a complementary metal-oxide-semiconductor (CMOS) device, and the CMOS device is electrically connected to the MEMS device through the semiconductor interconnector.

In some embodiments, the semiconductor interconnector comprises silicon material.

In some embodiments, at least one side of the semiconductor interconnector is at an outer boundary of the MEMS device. In certain embodiments, the semiconductor interconnector is surrounded by an insulator.

In some embodiments, the second type electrical terminal includes a cap. The cap is configured to cover the first type electrical terminal and an electromechanical component of the MEMS device, but not the semiconductor interconnector. In certain embodiments, the semiconductor interconnector and the cap are made of a same material.

In some embodiments, an insulator is provided to separate the semiconductor interconnector and the cap. The insulator is a molding compound filling a trench between the semiconductor interconnector and the cap. In certain embodiments, the insulator is air.

In some embodiments, a semiconductor structure including a micro electromechanical system (MEMS) device is provided. The MEMS device includes a cap covering an electromechanical component of the MEMS device. The MEMS device further includes a semiconductor interconnector configured as an electrical terminal of the electromechanical component. In addition, the semiconductor interconnector is separated from the cap by an insulator. The insulator extends at the MEMS device and ends at an outer boundary of the MEMS device.

In some embodiments, the insulator includes a molding compound.

In some embodiments, the semiconductor interconnector is disposed at one end of the MEMS device. In certain embodiments, the semiconductor interconnector includes silicon material.

In some embodiments, the MEMS device further includes a plurality of semiconductor interconnectors separated from each other by the insulator. The insulator includes multiple extensions extending in directions substantially perpendicular to each other at the MEMS device.

In some embodiments, a method for fabricating semiconductor device is provided. A micro electromechanical system (MEMS) device including an electromechanical component, a first type electrical terminal and a second type electrical terminal is provided. A cap is provided over the MEMS device so as to cover the electromechanical component, the first type electrical terminal and the second type electrical terminal. The cap is patterned such that a trench and a semiconductor interconnector are formed. The trench is configured between the semiconductor interconnector and the cap. In addition, the second type electrical terminal is interposed between the first type electrical terminal and the semiconductor interconnector.

In some embodiments, the method for fabricating semiconductor device further includes filling the trench with a molding compound. In addition, the molding compound is allowed to escape from the MEMS device through the trench.

In some embodiments, the method for fabricating semiconductor device further includes patterning a via and a cavity at the cap. The via is separated from the cavity. In addition, the via is greater in depth than the cavity.

In some embodiments, the method for fabricating semiconductor device further includes providing a molding compound over the cap and the semiconductor interconnector. The trench is filled such that an insulator is formed between the cap and the semiconductor interconnector. The molding compound is patterned to reveal the insulator. A passivation is provided over the cap and the semiconductor interconnector. The passivation is patterned such that a via exposing part of the semiconductor interconnector is formed. The via is filled such that a connector is formed. The connector is electrically connected with the semiconductor interconnector. A bump is provided over the connector. Accordingly, the bump is electrically connected to the first type electrical terminal of the MEMS device through the semiconductor interconnector.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor structure, comprising:
    a micro electromechanical system (MEMS) device, comprising:
        a first type electrical terminal of the MEMS device;
        a semiconductor interconnector for connecting the first type electrical terminal with an external circuitry;
        a conductor electrically connecting the semiconductor interconnector with the first type electrical terminal;
        a second type electrical terminal of the MEMS device surrounding the first type electrical terminal and interposed between the semiconductor interconnector and the first type electrical terminal; and
        an isolative layer around the conductor and under the first type electrical terminal, the second type electrical terminal and the semiconductor interconnector.

2. The semiconductor structure according to claim 1, further comprising a complementary metal-oxide-semiconductor (CMOS) device, wherein the MEMS device is electrically connected to the CMOS device through the semiconductor interconnector.

3. The semiconductor structure according to claim 2, wherein the MEMS device and the CMOS device are configured on a handle substrate.

4. The semiconductor structure according to claim 2, further comprising:
    a first conductive trace, for electrically connecting the MEMS device and the CMOS device.

5. The semiconductor structure according to claim 4, further comprising:
    a bump, electrically connecting to the first conductive trace for transmitting electrical signal out of the semiconductor structure.

6. The semiconductor structure according to claim 5, further comprising:
    a dielectric layer, disposed over the first conductive trace and patterned to have an opening for exposing a portion of the first conductive trace such that the bump is electrically connected to the first conductive trace.

7. The semiconductor structure according to claim 5, wherein the bump is a Cu bump, a metal bump including Ni or Au, or a magnetic or ferromagnetic bump.

8. The semiconductor structure according to claim 4, further comprising:
    a second MEMS device, electrically connected to the CMOS device through a second second conductive trace.

9. The semiconductor structure according to claim 8, further comprising:
    an isolative layer, for separating the first conductive trace and the second conductive trace.

10. The semiconductor structure according to claim 9, further comprising:
    a bump, electrically connecting to the second conductive trace for transmitting electrical signal out of the semiconductor structure.

11. The semiconductor structure according to claim 10, further comprising:
    a dielectric layer, disposed over the second conductive trace and patterned to have an opening for exposing a portion of the second conductive trace such that the bump is electrically connected to the second conductive trace.

12. The semiconductor structure according to claim 1, wherein the semiconductor interconnector comprises silicon.

13. The semiconductor structure according to claim 1, wherein the semiconductor interconnector is surrounded by an insulator.

14. The semiconductor structure according to claim 1, wherein the second type electrical terminal further comprises a cap covering the first type electrical terminal and an electromechanical component of the MEMS device,
    wherein the semiconductor interconnector is not covered by the cap.

15. The semiconductor structure according to claim 14, wherein the semiconductor interconnector and the cap are made of a same material.

16. The semiconductor structure according to claim 14, wherein the semiconductor interconnector is separated from the cap by an insulator.

17. The semiconductor structure according to claim 16, wherein the insulator comprises a molding compound.

18. The semiconductor structure according to claim 16, wherein the insulator is air.

19. The semiconductor structure according to claim 16, further comprising a plurality of semiconductor interconnectors separated from each other by the insulator.

20. The semiconductor structure according to claim 19, wherein the insulator comprises multiple extensions extending in directions substantially perpendicular to each other.

* * * * *